Figure 1A:
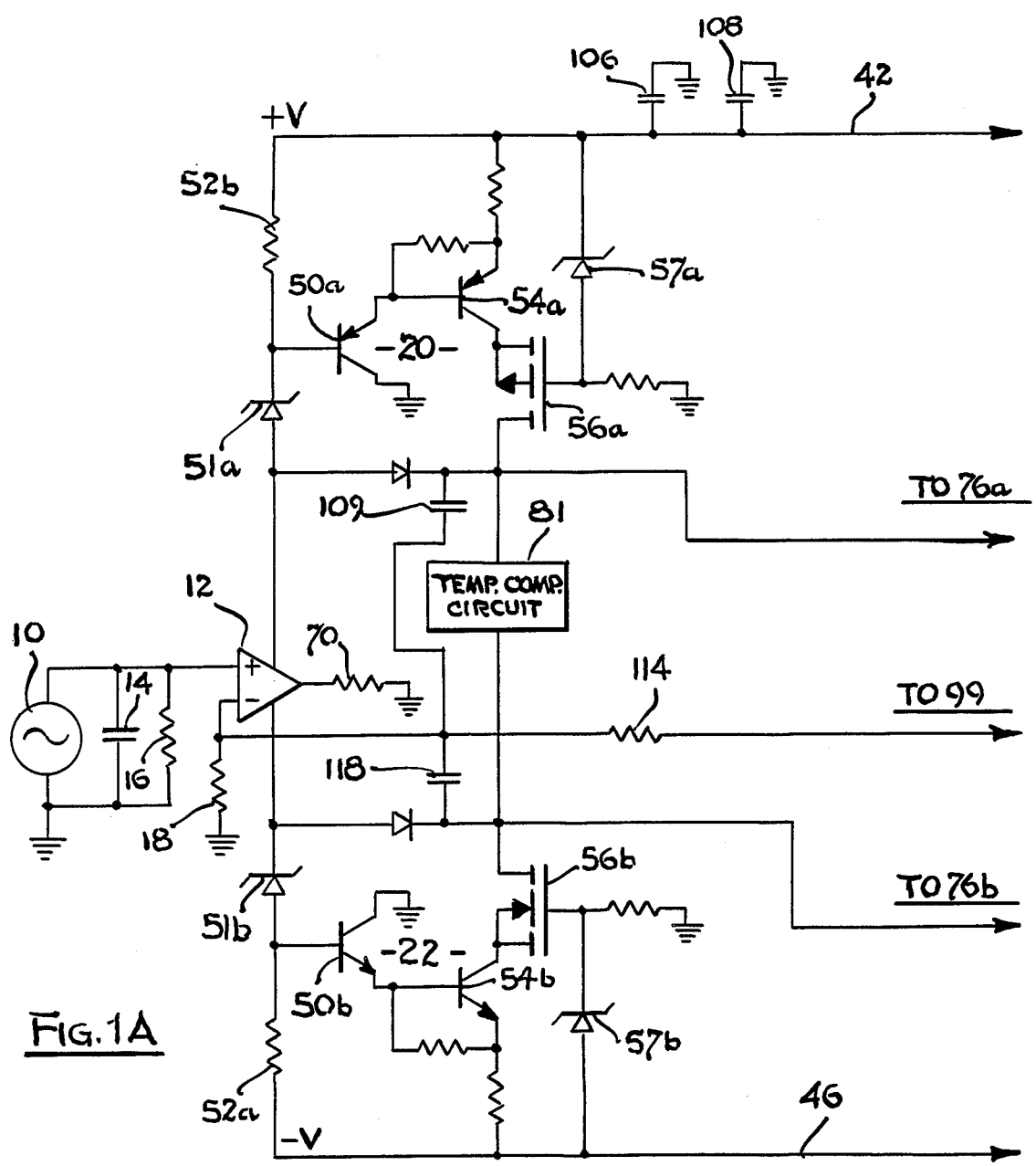

United States Patent [19]

Segal

[11] Patent Number: 4,713,629

[45] Date of Patent: Dec. 15, 1987

[54] SEMI-CONDUCTOR TRANSFORMERLESS AUDIO AMPLIFIER

[76] Inventor: Brahm R. Segal, 4265 Carlton Avenue, Montreal, Quebec, Canada

[21] Appl. No.: 932,787

[22] Filed: Nov. 19, 1986

[51] Int. Cl.[4] .......................... H03F 3/18; H03F 3/26
[52] U.S. Cl. .................................... 330/263; 330/268; 330/297
[58] Field of Search ............... 330/255, 267, 263, 268, 330/300, 297

[56] References Cited

U.S. PATENT DOCUMENTS

| 3,944,944 | 3/1979 | Ellenbecker | 330/149 |
| 4,319,199 | 3/1982 | Sunderland | 330/297 |
| 4,555,672 | 11/1985 | Segal | 330/255 |

OTHER PUBLICATIONS

"Circuit Ideas", Wireless World, Oct. 1981, p. 48.

Primary Examiner—Eugene R. LaRoche
Assistant Examiner—Nathan McCutcheon
Attorney, Agent, or Firm—Edward A. Sokolski

[57] ABSTRACT

The positive and negative outputs of an operational amplifier are employed to drive two oppositely phased current mirror circuits, which in turn drive oppositely phased power amplifier stages which drive the load directly without the use of an output transformer. Negative feedback is provided from the output to the operational amplifier to enhance flat response over the frequency range of interest. The oppositely phased power output stages are supplied by a power source which provides positive and negative supply voltages with reference to reference "ground". A plurality of capacitors are selectively connected as need be between the positive and negative voltage busses and ground to bypass spurious high frequency oscillations. A relatively high voltage output is achieved from the amplifier without exceeding the breakdown voltages of the transistors by employing a plurality of cascaded "Darlington" type circuits in the power amplifier.

5 Claims, 4 Drawing Figures

SEMI-CONDUCTOR TRANSFORMERLESS AUDIO AMPLIFIER

This invention relates to semi-conductor transformerless audio amplifiers and more particularly such an audio amplifier having a high power and relatively high voltage output.

In my U.S. Pat. No. 4,555,672 a transformerless semi-conductor audio amplifier is described in which the positive and negative outputs of an operational amplifier are employed to drive two oppositely phased current mirror circuits which provide a balanced high-power output and positive and negative mirror-image waveforms with respect to ground. In this system, distortion is minimized and high fidelity and stability is afforded by providing negative feedback, temperature compensation, and means for eliminating spurious high frequency oscillations.

The output of the amplifier described in my aforementioned patent has a high current, low voltage output which is adequate for applications in which a small number of loudspeakers need be driven and where the feeder lines to such loudspeakers are relatively short in length. In situations, however, where a large number of speakers must be driven, it is necessary to employ a step-up transformer to raise the voltage so that these multiple outlets can, in effect, be impedance-matched to the output of the amplifier and further, so that the power can be distributed at higher voltage and lower current to minimize "IR" losses in the feeder lines. The need for such transformers not only adds to the expense of the system, but also in themselves, contribute to losses, and sometimes contribute to distortion.

The audio amplifier system of the present invention is a modification of that of my aforementioned patent, whereby a relatively high-voltage, high-impedance output is provided for distribution to multiple loudspeaker outlets without the aforementioned shortcomings. Except for the modifications, to the current and power amplifier stages of the amplifier system, the amplifier of the present invention is basically the same as that of my prior patent and the disclosure of that patent is incorporated herein by reference.

It is therefore an object of this invention to provide a transformerless semi-conductor audio amplifier suitable for driving multiple loudspeaker outlets which may be at a distance from the amplifier.

It is a further object of this invention to provide a transformerless semi-conductor audio amplifier which has a relatively high voltage output signal.

Figure 2:
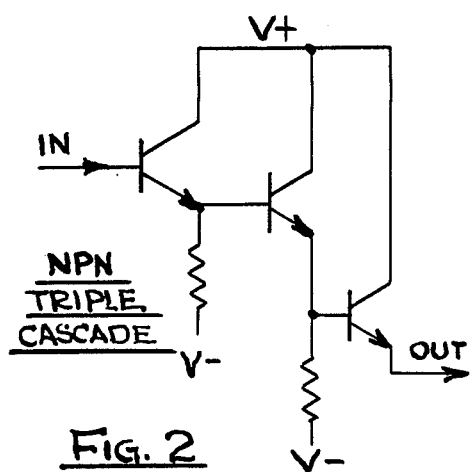
Figure 3:
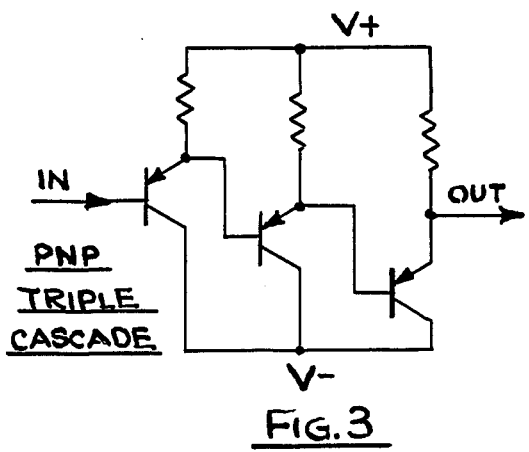

Other objects of the invention will become apparent as the description proceeds in connection with the accompanying drawings of which FIGS. 1A an 1B are schematic drawings of a preferred embodiment of the invention;

FIG. 2 is a schematic drawing illustrating a cascaded "Darlington" circuit employed in the amplifier and incorporating NPN transistors and, FIG. 3 is a schematic drawing illustrating a cascaded "Darlington" circuit employed in the power amplifier utilizing PNP transistors.

Figure 1B:
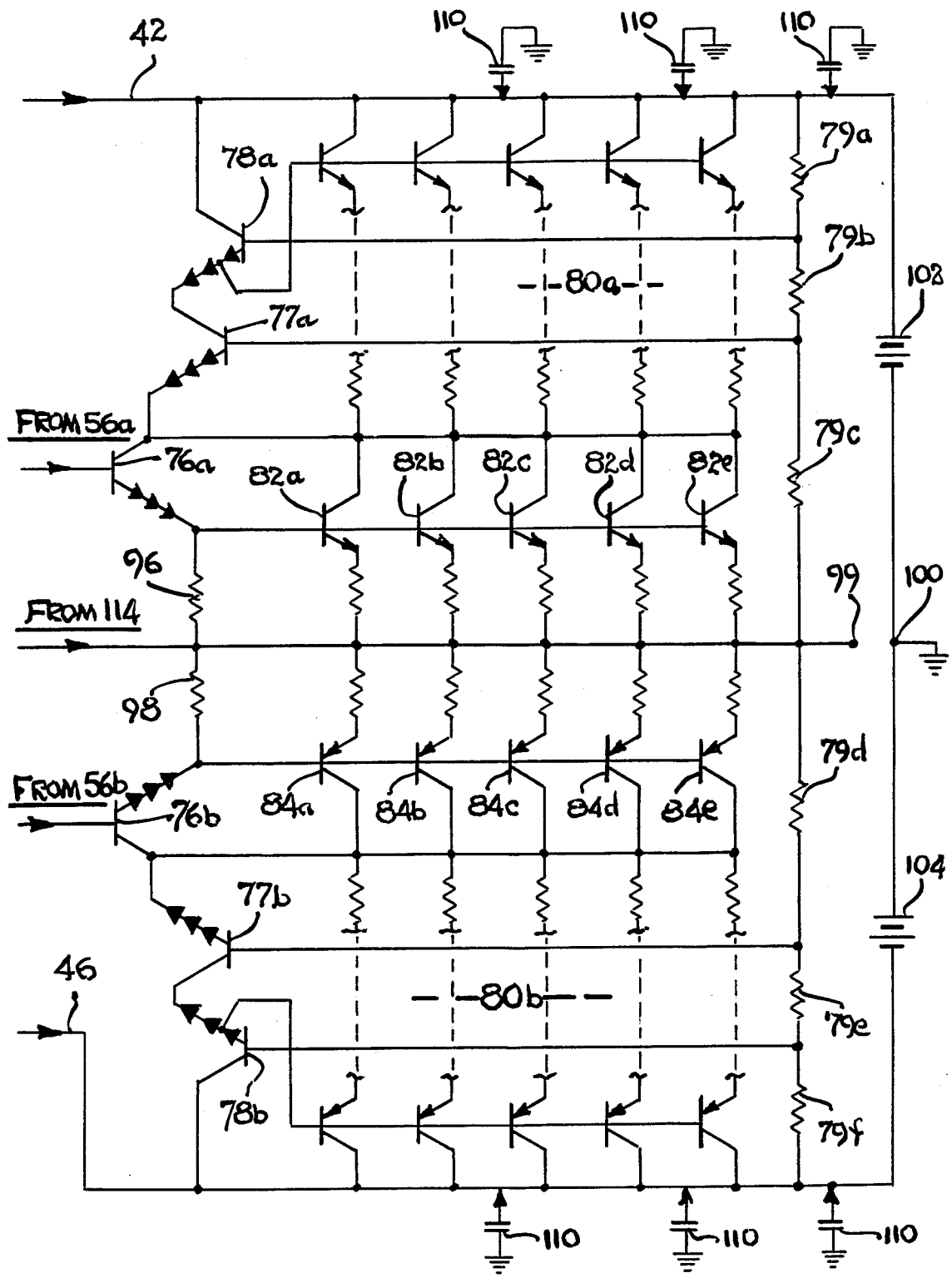

Referring now to FIGS. 1A and 1B, a preferred embodiment of the invention is schematically illustrated. A source of audio frequency signals 10 is applied between the positive or non-inverting input of operational amplifier 12 and ground across a small capacitor 14 which may be of the order of 30 PF and resistor 16. The inverting input of the amplifier is connected between resistor 18 and ground. Operational amplifier 12 functions as a voltage amplifier and its oppositely phased outputs are fed to drive the current amplifiers 20 and 22 in mirror image fashion. Amplifiers 20 and 22 are identical and include similar transistors 50 which are driven by the respective positive and negative outputs of amplifier 12 through Zener diodes 51a and 51b which are connected to the positive and negative busses 42 and 46 through an associated resistor 52a and 52b. Transistors 50a and 50b drive associated transistors 54a and 54b which are connected therewith in a "Darlington" configuration. The outputs of transistors 54a and 54b drive associated POWER MOSFETs 56a and 56b. Zener diodes 57a and 57b provide bias fior the POWER MOSFETs. POWER MOSFETs 56a and 56b operate to reduce the voltage stress placed on transistors 50 and 54.

The outputs of POWER MOSFETs 56a and 56b are fed to cascaded transistor circuits 76a and 76b, respectively. These circuits each comprise three transistors connected in cascaded "Darlington" configuration as shown in FIGS. 2 and 3, respectively, the three arrows each representing one of the transistors in the cascade. Connected between the collectors of the transistors of the triple cascaded circuit 76a and positive voltage bus 42 are first and second triple cascaded transistor circuits 77a and 78a, each of these circuits being as shown in FIG. 2. Similarly, connected between the collectors of the cascaded transistors 76b and the negative voltage bus 46, are cascaded transistor circuits 77b and 78b which are connected as shown in FIG. 3. Six identical resistors, 79a–79f, are connected between the positive voltage bus 42 and the negative voltage bus 46, with the juncture between resistor 79c and 79d being connected to output terminal 99. Resistors 79a–79f provide a voltage divider from the output line provided equal drive for each of the cascaded transistor circuits 77a, 78a, 77b and 78b. Such drive from the output results in higher linearity.

An analysis will readily show that the transistors in the cascaded circuits 76a, 77a and 78a will equally share the voltage for any output signal during the positive half cycles, while the same will be true for cascaded stages 76b, 77b and 78b during the negative half cycles. So also the transistors will share power dissipation. In this manner a high voltage output is provided without exceeding the breakdown voltages or power dissipation ratings of the transistors.

The outputs of the cascaded circuits 76a and 76b are fed to paralleled power transistors 82a–82e and 84a–84e, respectively as in the system of my U.S. Pat. No. 4,555,672. The outputs of cascaded stages 77a, 78a and 77b and 78b are also fed to similar paralleled power transistors which are only partially shown in FIG. 1 for convenience of illustration.

As in the device of my prior U.S. Pat. No. 4,555,672, various capacitors 110 are selectively connected at various points between both the positive and negative power busses 42 and 46 and ground to eliminate any spurious high frequency oscillations which may arise. Also, as in my prior patent, negative feedback is provided from the output terminal 99 through resistor 114 to the inverting input of operational amplifier 12. Still further, as in the system of my prior patent, harmonic distortion is minimized by means of feedback capacitors 109 and 118 which provide negative feedback to the inverting input of operational amplifier 12. Temperature compensating circuit 81 is also employed, as in the system of my prior patent, between the inputs to transistor circuits 76a and 76b. This circuit operates as a current regulator to provide DC stability to the system with variations in temperature. As all of these just-mentioned circuits are described in detail in my U.S. Pat. No. 4,555,672, the disclosure of such circuits is supplemented by the incorporation of the disclosure of U.S. Pat. No. 4,555,672 into the present application by reference thereto.

While the invention has been described and illustrated in detail, it is clearly understood that this is intended by way of illustration and example only and is not to be taken by way of limitation, the spirit and scope of the invention being limited only by the terms of the following claims:

I claim:

1. A semi-conductor transformerless audio amplifier comprising:
   a power source having positive and negative terminals providing equal positive and negative voltages with respect to a reference source,
   an output terminal,
   an input signal source,
   voltage amplifier means connected between the positive and negative terminals of the power source for receiving said input signal and generating a pair of outputs in phase opposition in response thereto,
   separate current amplifier means for respectively amplifying each of the outputs of said voltage amplifier means,
   a voltage divider formed of equal value resistors connected in series between the positive terminal and the output terminal and between the negative terminal and the output terminal,
   a first set of cascaded transistors connected with the emitter of the output transistor of the cascade coupled to the output terminal and with the base of the input transistor of the cascade driven by one of said current amplifier means,
   a second set of cascaded transistors connected with the emitter of the output transistor of the cascade coupled to the output terminal and with the base of the input transistor of the cascade driven by the other of said current amplifier means,
   a third set of cascaded transistors with the emitter of the output transistor of the cascade connected to the collectors of said first set of cascaded transistors and the collectors of said third set of transistors coupled to the positive power terminal, the base of the input transistor of the cascade of the third set of transistors being connected to a portion of the voltage divider between the positive terminal and output terminal, and
   a fourth set of cascaded transistors with the emitter of the output transistor of the cascade connected to the collectors of said second set of cascaded transistors and the collectors of said fourth set of cascaded transistors coupled to the negative power terminal, the base of the input transistor of the cascade of the fourth set of transistors being connected to a portion of the voltage divider between the negative terminal and output terminal.

2. The amplifier of claim 1 and further including fifth and sixth sets of cascaded transistors, the collectors of the transistors of said fifth set being connected to the positive terminal, the collectors of the transistors of said sixth set being connected to the negative terminal, the emitter of the input transistor of the fifth set being connected to the collectors of the transistors of the third set, the emitter of the input transistor of the sixth set being connected to the collectors of the transistors of the fourth set, the base of the input transistor of the fifth set being connected to a portion of the voltage divider between the positive terminal and the portion of the divider to which the base of the input transistor of the third set of transistors is connected, the base of the input transistor of the sixth set of transistors being connected to a portion of the divider between the negative terminal and the portion of the divider to which the base of the input transistor of the fourth set of transistors is connected.

3. The amplifier of claim 1 wherein each of said current amplifier means includes first and second transistors connected in cascade and a power MOSFET connected in cascade with said second transistor to reduce the voltage stress on said first and second transistors.

4. An audio amplifier comprising:
   an input amplifier having inverting and non-inverting inputs, positive and negative bias ports and an output, the non-inverting input being a signal input,
   a positive potential source having positive and reference terminals,
   a negative potential source having a negative terminal and a reference terminal common with that of said positive potential source,
   a first current amplifier having an input coupled between the positive bias port of said input amplifier and said positive terminal and having a first current amplified output,
   a second current amplifier having an input coupled between the negative bias port of the input amplifier and said negative terminal and having a second current amplified output,
   an amplifier output terminal,
   a first transistor amplifying circuit comprising a first plurality of transistors connected in cascaded configuration, a first emitter resistor connected between the emitter of the output transistor of said first plurality of transistors and the amplifier output terminal, the output of said first current amplifier being fed as an input to said first transistor amplifying circuit,
   said first transistor amplifying circuit further including a second plurality of transistors connected in cascaded configuration between said positive terminal and the collectors of the first plurality of transistors,
   a second transistor amplifying circuit comprising a third plurality of transistors of opposite polarity to the transistors of said first amplifying circuit and including a third plurality of transistors connected in a cascaded configuration, a second emitter resistor connected between the emitter of the output transistor of said third plurality of transistors and the amplifier output terminal, the output of said second current amplifier being fed as an input to said second transistor amplifying circuit,
   said second transistor amplifying circuit further including a fourth plurality of transistors connected in cascaded configuration between said negative terminal and the collectors of said third plurality of transistors,
   a resistor divider network comprising a plurality of equal value resistors connected between the amplifier output terminal and said negative potential source and between said amplifier output terminal and said positive potential source, the input to said second plurality of cascaded transistors being connected to a portion of said divider network between the positive potential source and the amplifier output terminal, the input to said fourth plurality of transistors being connected to a portion of said divider between the negative potential source and the amplifier output terminal, a first power amplifier connected to deliver current between the positive potential source and the amplifier output terminal, a second power amplifier connected to deliver current between the negative potential source and the amplifier output terminal, said first and second power amplifiers each comprising a separate amplifier stage driven by a separate output of one of the first through fourth plurality of cascaded transistors, a negative feedback circuit connected between the amplifier output terminal and the inverting input of the input amplifier, and a plurality of capacitors of different capacitances each separately connected between the negative and reference terminals and between the positive and reference terminals.

5. The amplifier of claim 1 wherein each of said current amplifiers comprises a pair of cascaded transistors driving a POWER MOSFET in cascade.

* * * * *